United States Patent [19]

Nishizawa

[11] Patent Number: 5,585,654
[45] Date of Patent: Dec. 17, 1996

[54] FIELD EFFECT TRANSISTOR HAVING SATURATED DRAIN CURRENT CHARACTERISTIC

[75] Inventor: Jun-ichi Nishizawa, Sendai, Japan

[73] Assignee: Handotai Kenkyu Shinkokai, Sendai, Japan

[21] Appl. No.: 782,789

[22] Filed: Oct. 24, 1991

Related U.S. Application Data

[63] Continuation of Ser. No. 303,105, Sep. 17, 1981, abandoned, which is a continuation of Ser. No. 817,052, Jul. 19, 1977, Pat. No. 4,337,473, which is a continuation of Ser. No. 569,871, Apr. 21, 1975, abandoned, which is a continuation-in-part of Ser. No. 413,266, Nov. 6, 1973, abandoned, which is a continuation-in-part of Ser. No. 248,022, Apr. 27, 1972, abandoned.

[30] Foreign Application Priority Data

Apr. 28, 1971 [JP] Japan .................................. 46-28405

[51] Int. Cl.$^6$ .................................................. H01L 29/808
[52] U.S. Cl. ........................... 257/264; 257/263; 257/266
[58] Field of Search .................................. 257/263, 264, 257/265, 266, 268, 287

[56] References Cited

U.S. PATENT DOCUMENTS

| | | | |
|---|---|---|---|
| 2,790,037 | 4/1957 | Shockley | 257/256 |
| 3,126,505 | 3/1964 | Shockley | 257/266 |

OTHER PUBLICATIONS

Dacey et al, Proceedings of the IRE, Aug. 1953, pp. 970–979.
Grove, Physics and Technology of Semiconductor Devices, Wiley, NY, 1967, pp. xiii–xix, 243–259.
Kim et al, Solid–State Electronics, vol. 13, 1970, pp. 1577–1589.
Denshi Temboh, vol. 8, Jun. 1971, Seibundo Shikosha Publishing Co. Ltd, Tokyo, pp. 63–66.
Sze, Physics of Semiconductor Devices, First Edition, Wiley, NY, 1969, pp. 340–355.
Nishizawa et al, IEEE Transactions on Electron Devices, vol. ED22, Apr. 1975, pp. 185–197.
Mochida et al, IEEE Transactions on Electron Devices, vol. ED25, Jul. 1978, pp. 761–767.
Zuleeg, Proceedings of the IEEE, Oct. 1964, pp. 1245–1246.
Teszner et al, Proceedings of the IEEE, Dec. 1964, pp. 1502–1513.
Zuleeg, Proceedings of the IEEE, Dec. 1965, pp. 2111–2112.
Neumark et al, Solid–State Electronics, vol. 10, 1967, pp. 299–304.
Zuleeg, Solid–State Electronics, vol. 10, 1967, pp. 449–460.
Zuleeg, Solid–State Electronics, vol. 10, 1967, pp. 559–576.
Hauser, Solid–State Electronics, vol. 10, 1967, pp. 577–587.
Richman, IEEE Transactions on Electron Devices, vol. ED16, No. 9, Sep. 1969, pp. 759–766.

*Primary Examiner*—William D. Larkins
*Attorney, Agent, or Firm*—Cushman Darby & Cushman, L.L.P.

[57] ABSTRACT

A field effect transistor has the property that the product of its series resistance and its true transconductance is less than one throughout the entire range of drain voltage in the operative state of the transistor, the series resistance being the sum of the resistance from source to channel and the resistance of this channel. In order to prevent an excessive increase in the active resistance of the channel, the channel is made to have an impurity concentration as low as less than $10^{15}$ atoms/cm$^3$, preferably less than $10^{14}$ atoms/cm$^3$, so that the depletion layers extending from the gates grow extensively to become contiguous in response to a small increase in the reverse gate voltage applied. As a result, the field effect transistor of this invention has an unsaturated drain current versus drain voltage characteristic.

62 Claims, 2 Drawing Sheets

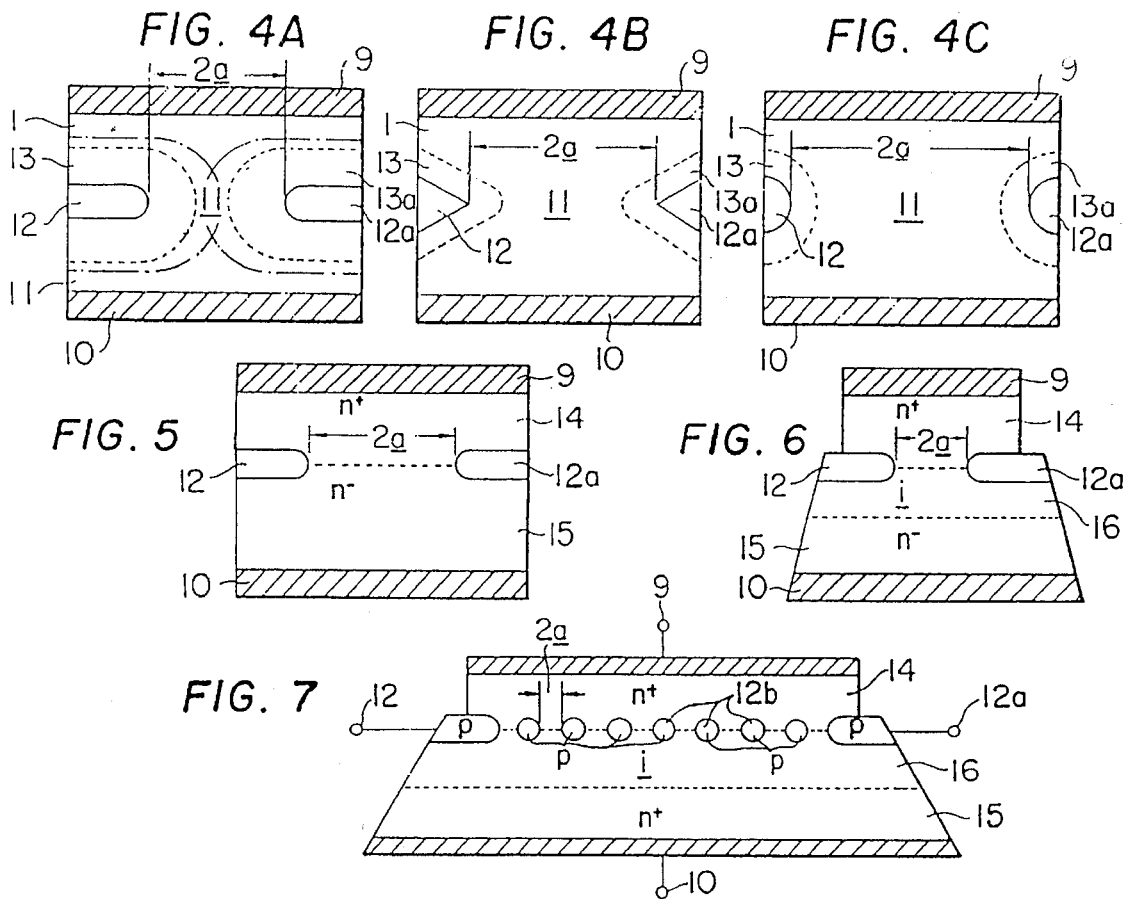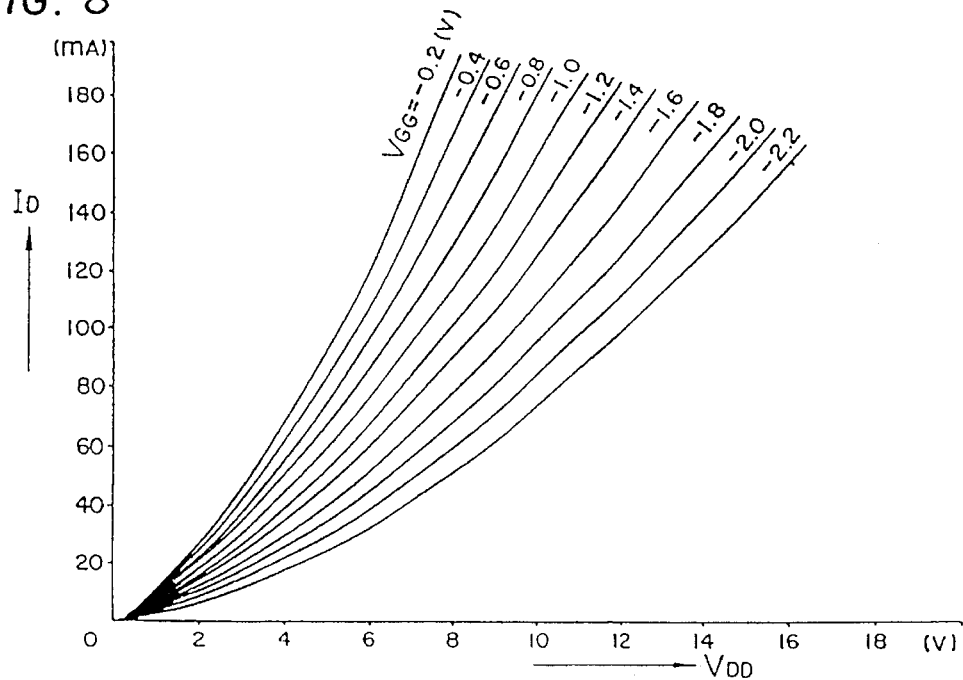

FIELD EFFECT TRANSISTOR HAVING SATURATED DRAIN CURRENT CHARACTERISTIC

CROSS REFERENCE TO RELATED APPLICATIONS

This is a continuation of 06/303,105 Sep. 17, 1981 abandoned, which was a continuation of 05/817,052 Jul. 19, 1977 U.S. Pat. No. 4,337,473, which was a continuation of 05/569,871 Apr. 21, 1975 abandoned, which was a continuation in part of 05/413,266 Nov. 6, 1973 abandoned, which was a continuation in part of 05/248,022 Apr. 27, 1972 abandoned.

BACKGROUND OF THE INVENTION

1. Field of the Invention

This invention relates to field effect transistors.

2. Description of the Prior Art

Field effect transistors are developed as a kind of active element for directly controlling, by the gate voltage, majority carriers flowing through the semi-conductor channel from source to drain. However, since the conventional field effect transistors do not have a large apparent transconductance gm and do have a saturation characteristic, the conventional field effect transistors are not suitable for use in low impedance load high power and high frequency range operations.

To make clear the difference in the features of transistors embodying this invention and those of conventional field effect transistors, the latter are first described. With reference to FIG. 1, a conventional field effect transistor comprises a semiconductor crystal 1 of one conductivity type (n-type or p-type), a source electrode 2 ohmically provided at one end of the semi-conductor crystal 1, a drain electrode 3 ohmically provided at the other end of the semiconductor crystal 1, and gates 4 and 4a provided at opposite sides of the semiconductor crystal 1. A dc power supply $V_{DD}$ is connected across the source 2 and the drain 3 for passing a drain current $I_D$, while a dc bias supply $V_{GG}$ is connected across the source 2 and the gates 4 and 4a for controlling the drain current $I_D$.

In addition to the above mentioned field effect transistor of the junction type, field effect transistors of the MOS type have been developed but operate in accordance with the principle similar to the junction type field effect transistor. In field effect transistors of the junction type, majority carriers are controlled by a control voltage in contrast to a current controlled transistor such as bipolar transistors, so that the junction FET has advantages, such as a high input impedance, no storage effect, a small noise figure and a good transfer characteristic. Accordingly, the junction FET has a wide application including amplification of, for example, a voice signal.

Now, reference is made to FIG. 2. In the lower source-drain voltage range, the drain current $I_D$ linearly increases along a line determined by the resistivity and geometric shape of the semiconductor crystal 1 (e.g. silicon) in accordance with Ohm's law. However, the drain current $I_D$ saturates in case the drain voltage exceeds a certain level which is called the pinch-off voltage $V_P$ as described below, so that the conventional FET has a saturation characteristic similar to that of a vacuum tube pentode. In accordance with the conventional theory, this saturation phenomenon has been explained that the depletion layers grow enough to close the conduction path in the channel. However, this closure of the conduction path fails to adroitly explain the fact that the current still continues flowing even after the pinch-off point $V_P$. In order to obtain a solution of this problem, the inventor made an extensive study and a number of experiments. As a result, the inventor found that the saturation phenomenon is caused mainly by the behavior of the series resistance of especially the portion leading from the source to the pinch-off point. More specifically, below the pinch-off voltage $V_P$, the active series resistance of the current path from the source electrode 2 up to the pinch-off point remains substantially small and constant because this path is sufficiently broad. Whereas, above the pinch-off voltage $V_P$, the current path becomes narrowed causing said series resistance to increase to such an extent that the voltage drop caused by the drain current through this series resistance acts strongly to further inflate the depletion layer, so that the width of the current path becomes further narrower. Accordingly, this active series resistance which is represented by $R_S$ abruptly becomes much larger. This increase of the series resistance $R_S$, in turn, acts to suppress the increasing trend of the drain current which would otherwise follow the increase of the drain voltage. This phenomenon may be interpreted as the so-called negative feed-back action within the FET.

The relation of the pinch-off voltage $V_P$ with the ionized impurity density N, the unit electron charge q, the half channel width a, the dielectric constant e of the semiconductor 1 and the gate voltage $V_G$ applied is as shown by the following equation (1):

$$V_P = \frac{qNa^2}{2e} + V_G \tag{1}$$

On the other hand, said pinch-off voltage $V_P$ has the relation with the series resistance $R_S$ at pinch-off time and the saturated drain current $I_{DSS}$ as shown by the following equation (2):

$$V_P = R_S \cdot I_{DSS} \tag{2}$$

Since the apparent transconductance gm is defined by:

$$gm = \frac{\delta I_{DSS}}{\delta V_G}, \tag{3}$$

there has been derived the consideration that the apparent transconductance gm is substantially equal to $1/R_S$.

The saturation characteristic relies also on the geometric dimension of the field effect transistor. With reference to FIG. 3 showing a conventional FET made by the usual planar technique and having an n-type channel 8, a source 6 and a drain 7 are provided on the same plane, with the distance between the source 6 and the channel 8 and the distance between the drain 7 and the channel 8 being relatively long. Moreover, the conventional FET has a long channel length L of more than several tens of micrometers and a length to half width ratio L/a of several tens to one hundred. The drain current is on the order of 10 milliamperes, and the apparent transconductance gm is less than 10 milli-mhos whereas the output power is about 100 milli-watts.

Accordingly, the conventional FET is not suitable for use in low impedance load, high power and high frequency range operations.

The above defects of the conventional FET are caused by the relatively large value of the serial sum of the resistances in the source, from the source to the channel, and in the channel, i.e. the series resistance $R_S$. In such a known FET, the channel is narrow and long so that the active resistance of this channel itself greatly increases in a non-linear manner in accordance with the spreading of the depletion layers. Thus, the saturation characteristic is caused to develop and the apparent transconductance gm will not be able to have a large value.

Now, let us here make some analytic discussion of the FET by introducing the conception that the FET is comprised of a combination of a first portion which is a real FET having no series resistance $R_S$ but having a true transconductance Gm and a second portion which is a series resistance $R_S$. Then, the aforesaid apparent transconductance gm is expressed by the following equation (4) by taking into consideration the negative feed-back action of this series resistance $R_S$:

$$gm = Gm/(1 + R_S \cdot Gm) \quad (4)$$

As will be apparent from this equation, when $R_S$ is large to give $R_S \cdot Gm \gg 1$, the relation $g_m \cong 1/R_S$ will take place and it may be said that the measured apparent transconductance is, in reality, the inverse of the series resistance $R_S$. Accordingly, it is only when $R_S Gm \ll 1$ that the relation $g_m \cong G_m$ is obtained, and thus an approximate value of the true transconductance Gm can be measured. In other words, in the state that a current $I_D$ is caused to flow by the application of an external drain voltage $V_D$, the voltage which is actually applied to the portion functioning as the real FET is not $V_D$ but only $(V_D - I_D R_S)$ in view of the series resistance $R_S$.

In the prior art, various attempts have been made to improve the performance characteristics of FET's by, for example, reducing the channel length to decrease the gate capacitance for improving the build-up characteristic as well as the high frequency operation. Such reduction of the channel length appears as if it would work so as to decrease this series resistance. In reality, however, the series resistance which was reduced in amount corresponding to the reduced channel length still showed in continuous rise with the increase in the drain voltage. The more closely the drain voltage approaches the pinch-off voltage, the quicker rises the rate of increase of this series resistance. This fact, namely, the increase in the series resistance of the channel, provides the condition $R_S \cdot G_m > 1$ and causes a decrease in the apparent transconductance gm. At the same time, this increase in $R_S$ together with the fact that the drain current is flowing will bring about an $I_D R_S$ drop and the voltage $V_D - I_D R_S$ will hardly increase as stated previously even when $V_D$ is increased. Thus, the current will never increase.

In short, it can hereby be recognized once again that the conventional FET having a saturation characteristic is not a real FET but that it is, in fact, a combination of a real FET with a series resistance which would cause an extrememly large increase in its value in accordance with an increase of the drain voltage and the drain current.

As a result of the research undertaken by the inventor, it has been confirmed that the existence of the saturation characteristic can never be avoided so long as the increase of the series resistance $R_S$ is not suppressed. This knowledge has led to the conclusion that the series resistance $R_S$ should be less than 1/Gm throughout the entire range of drain voltage in the operative state of the transistor. To accomplish this condition, the inventor provides such an FET that no narrow, lengthy current path will be formed for any drain voltage applied. Under the above mentioned condition, where the product $R_S \cdot Gm$ is less than one throughout the entire range of drain voltage in the operative state, the apparent transconductance gm is substantially equal to the true transconductance Gm. However, the conventional FET cannot satisfy the above condition so that the apparent transconductance gm of such an FET has a small value.

SUMMARY OF THE INVENTION

An object of this invention is to provide a field effect transistor having an unsaturated drain current versus drain voltage characteristic, a relatively high reverse breakdown voltage, a large output current capability, a large transcondutance, and a wide operable frequency range.

In accordance with the principle of this invention, the product of the series resistance and the true transconductance is less than one throughout the entire range of drain voltage in the operative state of the transistor since its resistance is inhibited from excessively increasing. To this end, the transistor is so designed that its depletion layers extending from the gates grow extensively so as to become broadly contiguous when a small increase in the reverse gate voltage is applied, with no formation of a narrow lengthy current path which makes a high series resistance. Therefore, the field effect transistor of this invention has a desirable unsaturated characteristic.

BRIEF DESCRIPTION OF THE DRAWINGS

The principle, construction and operation of this invention will be understood more clearly by reading the following detailed description taken in conjunction with the accompanying drawings.

FIGS. 4A, 4B, 4C are transverse vertical sections of transistors, respectively, embodying this invention.

FIGS. 5 and 6 are transverse vertical sections of other transistors, respectively, embodying this invention.

FIG. 7 is a transverse vertical section of a multi-channel type transistor embodying this invention.

FIG. 8 is a chart showing the drain current-drain voltage characteristic curves of the field effect transistor of this invention.

DETAILED DESCRIPTION OF THE PREFERRED EMBODIMENTS

Figure 1:
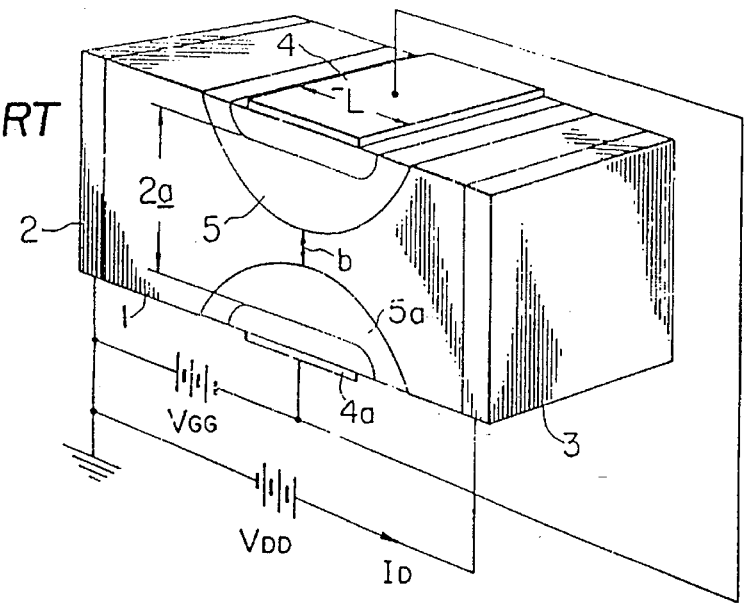
FIG. 1 is a perspective view illustrating an example of a conventional field effect transistor.
Figure 2:
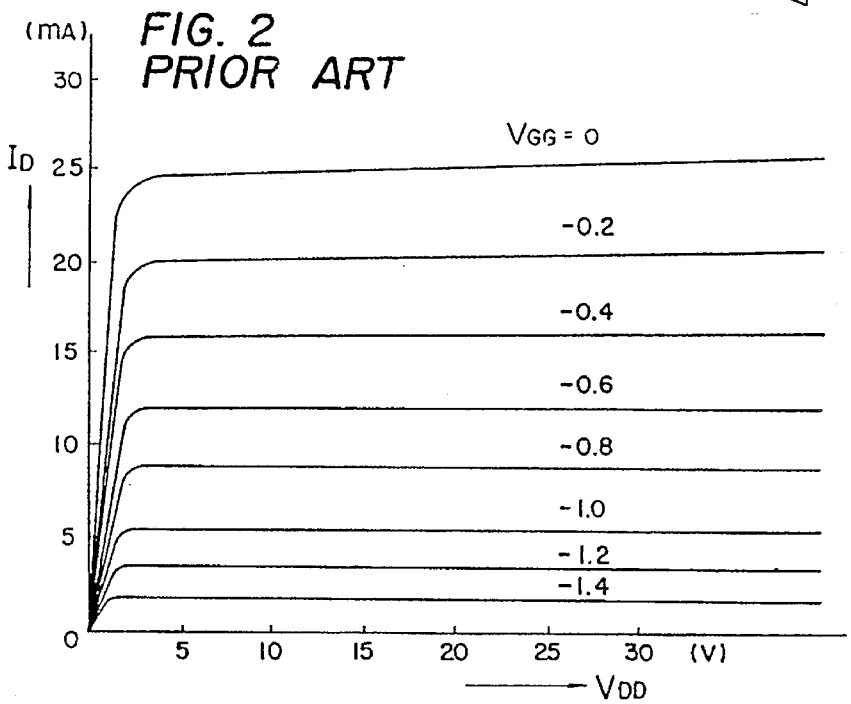
FIG. 2 is a chart showing the drain current-drain voltage characteristic curves of the coventional field effect transistor of FIG. 1.
Figure 3:
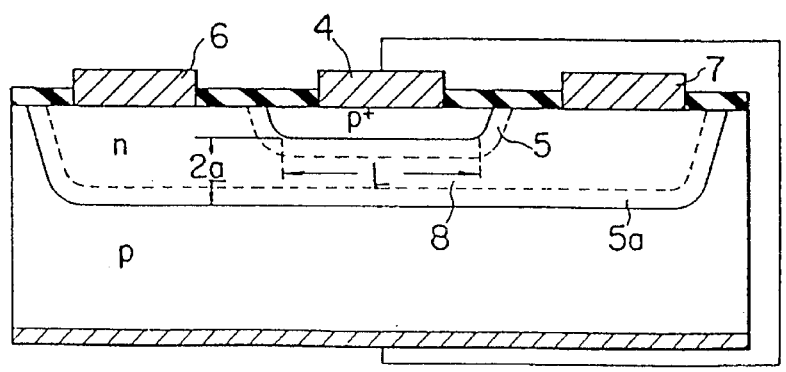
FIG. 3 is a longitudinal vertical section of another conventional field effect transistor.

With reference to FIGS. 4A, 4B and 4C, each of these embodiments of this invention comprises a semiconductor crystal 1 (e.g. silicon or germanium) of a first conductivity type, e.g. n-type, and having an impurity concentration less than about $10^{15}$ atoms/cm$^3$ (resistivity: 5 ohm-cm for n-type, 10 ohm-cm for p-type) and more than about $10^{12}$ atoms/cm$^3$ (resistivity: 500 ohm-cm for n-type, 1000 ohm-cm for p-type) which can be considered as being substantially intrinsic, a source 9 and a drain 10 provided on the opposite ends of the semiconductor crystal 1, and gates 12 and 12a provided at opposite sides of this semiconductor crystal 1 to protrude inwardly therefrom to face each other. As stated above, the semiconductor material has an impurity concentration of about $10^{15}$ atoms/cm$^3$, but the employment of a semiconductor material having an impurity density of less than $10^{14}$ atoms/cm$^3$ is preferred. The FET according to the present invention, needless to say, is used by applying a drain voltage across the drain electrode and the source electrode, and a gate voltage across the gate electrode and the source electrode. The channel has a length to half width ratio L/a lying between one tenth and two tenths for example. In FIG. 4A, the inward ends of these gates 12 and 12a have a rounded shape. In FIG. 4B, the gates 12 and 12a have wedge-shaped ends. In FIG. 4C, the gates 12 and 12a have hemispheric ends. As a result of the above constructions, the distance from the source 9 to the channel is shortened, and the effective length of this channel 11 is shortened also. Moreover, the shapes of the depletion layers 13 and 13a follow the shapes of the gates 12 and 12a, and the narrowest width of the channel is always located at a middle point between the respective opposing ends of the gates 12 and 12a. If the width 2a is selected to be about 25 micrometers, the depletion layers 13 and 13a will overlap each other in case the semiconductor channel has an impurity concentration of $10^{13}$ atoms/cm$^3$.

In preferred examples of design, the relation between the impurity concentration of the channel-constituting semiconductor material and the width 2a between the gates are as follows:

| Impurity Concentration | Width (2a) |
| --- | --- |
| $10^{15}$ atoms/cm$^3$ | about 2.5 micrometers |
| $10^{14}$ atoms/cm$^3$ | about 8 micrometers |
| $10^{13}$ atoms/cm$^3$ | about 25 micrometers |

By increasing the reverse gate voltage, the degree of overlapping of the depletion layers will increase, and thus the control of the drain current of this FET is accomplished.

The gates 12 and 12a may be formed also in a semiconductor body having a doughnut shape or a flat thin ring shape.

The FET as described with reference to FIGS. 4A, 4B and 4C has a channel constituted by a semiconductor material of a first conductivity type and having an impurity concentration less than about $10^{15}$ atoms/cm$^3$ so that the application of a very low reverse gate voltage and the presence of a very low IR drop by the drain current will cause the depletion layers to grow large to immediately become contiguous to each other and they will fill the channel, forming no such narrow lengthy conduction path that would exibit an increasing series resistance. The drain current flows through the depletion layers just as through the space in the vacuum tube and not through a high resistance path. Consequently, this FET has an $I_D$-$V_D$ characteristic similar to that of a vacuum tube triode, namely an unsaturated characteristic of drain current versus drain voltage. The FET of this invention having a triode characteristic is capable of delivering a high power output with a small distortion factor. Moreover, this FET has a high true transconductance Gm and the value of the series resistance $R_S$ remains substantially constant for any variation of the drain voltage applied, as contrasted by the series resistance $R_S$ which increases in a non-linear manner in accordance with the increase in the drain voltage applied in the conventional FET. The apparent transconductance gm of the FET of this invention will be understood to be substantially equal to the true transconductance Gm which is irrelevant to whatever series resistance that exists.

As discussed above, it has been confirmed by the inventor that, in order to obtain an FET having an unsaturated triode characteristic, it is essential and sufficient to design the FET so as to satisfy the condition $R_S \cdot Gm < 1$ for the entire operation range. This condition is given mainly by an impurity concentration less than $10^{15}$ atoms/cm$^3$ of the semiconductor body 1.

In other words, the channel of the field effect transistor of this invention has a high resistivity region (e.g. 50 ohm-cm for an n-type semiconductor) as compared with that ok the conventional FET. This, one may say, seems contradictory to the requirement that the series resistance be low. However, such a conclusion is made from considering only the static aspect. The present invention has been worked out indeed from the dynamic standpoint of the FET operation. It is needless to say that the resistivity is determined in accordance with the degree of the density of impurity.

Due to said low impurity concentration, the thickness of the depletion layers 13 and 13a grow widely into the channel region, and the width of these depletion layers varies in a highly sensitive manner in accordance with the changes of voltages such as the source-gate voltage, the source-drain voltage and the IR drop voltage in the channel. As a result, the depletion layers develop an overlapping condition immediately even for low gate and drain voltages as shown by the chain lines in FIG. 4A and do not leave a narrow lengthy current path between these layers.

The allowable limit of voltage between the source 9 and the drain 10 can be enchanced by providing a highly doped n$^+$ layer 14 on top of a normally doped n$^-$ layer 15 by the epitaxial vapor deposition technique as shown in FIG. 5.

The breakdown voltage as well as the usable dynamic range of this FET can be increased by inserting an intrinsic i layer 16 between the highly doped n$^+$ layer 14 of a lower resistivity and the low-doped n$^-$ layer 15 of a higher resistivity as shown in FIG. 6.

In FIG. 7 which illustrates an embodiment of this invention of the multi-channel FET type, a mesh gate 12b of a p-type semiconductor is formed in a semiconductor body having the gates 12 and 12a of a p-type semiconductor. In an example of methods of producing this embodiment, (a) an n$^+$ layer 15 of a lower resistivity is provided on one surface of the intrinsic layer 16 by crystal growth or diffusion of impurity; (b) a mesh gate 12b of a p-type semiconductor is provided on the other surface of the intrinsic layer 16 by selective diffusion or selective crystal growth; and (c) an n$^+$ layer 14 of a lower resistivity is provided on the mesh gate 12b. A source 9 and a drain 10 are provided on the layers 14 and 15 respectively as ohmic contacts. The intrinsic layer 16 and the n$^+$ layer 15 are formed into a mesa type to avoid breakdown at the surface of the crystal. The order of the above steps (a), (b) and (c) may be changed as required. In the above example, the layers 14 and 16 are an n-type semiconductor while the mesh gate 12b is made with a p-type semiconductor. However, the layers 14 and 16 may be made with a p-type semiconductor, whereas the mesh gate 12b may be made with an n-type semiconductor. In this embodiment, the channel has a length L to half-channel width a ratio L/a which has a very small value of about 0.2 for example. Typical characteristics of an FET having such construction are shown in FIG. 8. The FET of this type has a source-drain current of 100 milli-amperes, an apparent transconductance gm of 100 milli-mhos and an output power of several watts, which are several-tens times of the conventional characteristics. An FET having an output power of several-kilowatts can be actually realized in accordance with this invention.

Some examples of the degree of impurity density and corresponding resistivity of the semiconductor material will be shown hereunder.

| Phase | Impurity Concentration | Resistivity |
|---|---|---|
| n⁺ | $10^{18}$–$10^{19}$ atoms/cm³ | 0.025–0.005 ohm-cm |
| n⁻ | $10^{14}$–$10^{15}$ atoms/cm³ | 50–5 ohm-cm |
| i | about $10^{12}$ atoms/cm³ | about 5000 ohm-cm |

The above principle can be applied to an FET of the injection type in which majority carriers are injected from a highly doped source so that these carriers increase greatly as compared with the inherent carrier density in the channel.

By the insertion, in the channel region, of a high resistivity layer which is considered as substantially intrinsic as mentioned above, the saturated drain current characteristic caused by the negative feedback action due to the non-linear increase of the series resistance in the conventional FET can be effectively eliminated. Accordingly, the FET of the present invention having such unsaturable drain current characteristic can be regarded as a linear variable resistance element. While the input impedance of this FET is as high as that of the conventional FET, the output impedance thereof is low unlike the conventional FET. Therefore, a new type of FET having a high operation frequency range and having a high output power capability can be readily produced by satisfying the above-stated condition.

The condition for obtaining the field effect transistor of this invention can be summarized so that a product $R_S \cdot Gm$ is less than one in the entire range of drain voltage in the operative state. In practice, a high resistivity region of substantially intrinsic material in which the depletion layers are readily spread is employed therein. Since the spread of the depletion layers can vary in accordance with a square root of V/N (V: the bias voltage, N: the impurity concentration), and since this spread of the depletion layers is about eight micrometers in case of silicon when its impurity concentration is $1 \times 10^{13}$ atoms/cm³ under no bias voltage, the depletion layers become contiguous to each other under a bias voltage of about one volt in the case of a wide gate space of about twenty micrometers which has never been employed in known FET. As mentioned above, the channel width and the impurity concentration are factors to determine a voltage at which the depletion layers are made contiguous to each other.

To make the merits of this invention clear against the prior art, some references which disclose FET's having a triode characteristic are mentioned below. One of them has been developed by R. Zuleeg of Boeing Co. and it utilizes the avalanche phenomenon occurring near the gates. However, the avalanche current flows also through the gates, so that the input impedance of the gates is greatly reduced so as to lose the advantageous features as an FET. In another prior art FET a punch-through effect is caused for a source current since the drain voltage affects the source and since the channel becomes entirely a depletion layer directed to the source. (See: "Trans. on Electron Device" Vol. ED-16, No. 9, September 1969, P759, "Modulation of Space-Charge-Limited Current Flow in Insulated-Gate Field-Effect Tetrodes" by Paul Richman). However, the punch-through effect is not caused in the element proposed in this reference unless the length of the channel is short and impurity in the channel is negligible. Accordingly, designing of the element of this type is very difficult to make. Moreover, the dynamic range of the gate voltage is narrow whereas a breakdown voltage is low.

As mentioned above, the defects of the conventional field effect transistors can be effectively eliminated in accordance with this invention while their advantages are maintained.

Description of the present invention has been made with respect to junction FET, but it should be understood that the present invention can be equally effectively applied to MOS FETs though not illustrated or described in this specification for the sake of simiplicity of explanation.

Also, description of the present invention has been made with respect to PET whose semiconductor material is made of silicon, but it should be understood that the semiconductor material may be made of germanium.

I claim:

1. In a field effect transistor comprising:

a semiconductor region of a first conductivity type, a source and a drain provided at opposite ends of said semiconductor region, and gate means of p-type semiconductor material, provided adjacent to said semiconductor region, for defining a channel portion of said semiconductor region and for controlling the flow of drain current between said source and said drain through said channel portion, said channel portion having a length along the direction of flow of said drain current and a width transverse to the direction of flow of said drain current, said drain and said gate means being adapted to be applied with a drain voltage and a gate bias voltage from external voltage sources, respectively, the improvement wherein:

said semiconductor region is formed of a semiconductor material having a low impurity concentration; and the product of the series resistance and the true transconductance of said field effect transistor is maintained less than one in at least a portion of the operative state of said transistor in which state a drain current is flowing, to provide substantially throughout said state an unsaturated drain current versus drain voltage characteristic for any operative value of said gate bias voltage, said series resistance being the sum of the resistance in said source, the resistance from said source to said channel portion and the resistance of said channel portion.

2. A field effect transistor according to claim 1, in which the semiconductor material of said channel portion is silicon having a lightly doped impurity concentration.

3. A field effect transistor according to claim 2, in which said channel portion of the semiconductor material has a lightly doped impurity concentration and said width of the channel is about 25 micrometers.

4. A field effect transistor according to claim 1, in which the ratio of the length of said channel portion to one half the width of said channel is between one tenth and two tenths.

5. A field effect transistor according to claim 1, in which said semiconductor region comprises an intrinsic semiconductor region and n-type semiconductor layers provided on opposite surfaces of said intrinsic semiconductor region, said gate means comprising a mesh of p-type semiconductor positioned along a boundary region between the intrinsic semiconductor region and one of said n-type layers.

6. A field effect transistor according to claim 1 in which the semiconductor material within said channel portion is silicon and has a lightly doped impurity concentration.

7. A field effect transistor according to claim 1 in which the semiconductor region includes a highly doped n⁺ layer and said gate means being positioned along the boundary region of said highly doped layer.

8. In a field effect transistor comprising:

a semiconductor region of a first conductivity type, a source and a drain provided at opposite ends of said semiconductor region, and gate means of p-type semiconductor material, provided adjacent to said semiconductor region, for defining a channel in said semiconductor region and for controlling the flow of drain current between said source and said drain, said drain and said gate means being adapted to be applied with a drain voltage and a gate bias voltage from external voltage sources, respectively, the improvement comprising:

said semiconductor region being formed of a semiconductor material having a low impurity concentration;

the product of the series resistance and the true transconductance of said field effect transistor being maintained less than one for low magnitudes of drain current irrespective of the gate bias voltage, thereby providing an unsaturated drain current versus drain voltage characteristic in the main operative state of said transistor; and said series resistance being the sum of the resistance in said source, the resistance from said source to said channel and the resistance of said channel.

9. In a field effect transistor comprising:

a semiconductor region of a first conductivity type, a source and a drain provided at opposite ends of said semiconductor region, and gate means, provided adjacent to said semiconductor region, for defining a channel portion of said semiconductor region and for controlling the drain current between said source and said drain flowing through said channel portion, said channel portion having a length along the direction of flow of said drain current and a width transverse to the direction of flow of said current, said drain and said gate means being adapted to be applied with a drain voltage and a gate bias voltage from external voltage sources, respectively, the improvement wherein:

said semiconductor region is formed of a semiconductor material having a low impurity concentration; and the product of the series resistance and the true transconductance of said field effect transistor is maintained less than one in at least a portion of the operative state of said transistor in which state a drain current is flowing, to provide substantially throughout said state an unsaturated drain current versus drain voltage characteristic for any operative value of said gate bias voltage, said series resistance being the sum of the resistance in the source, the resistance from said source to said channel portion and the resistance of said channel portion, and said semiconductor region includes first and second intrinsic semiconductor regions disposed at said opposite ends, and n-type semiconductor layers provided at said first and second intrinsic semiconductor regions, said gate means comprising a mesh of p-type semiconductor material provided along a boundary region between one of said intrinsic semiconductor regions and one of said n-type layers.

10. In a field effect transistor comprising:

a semiconductor region of a first conductivity type, a source and a drain provided at opposite ends of said semiconductor region, and gate means, provided adjacent to said semiconductor region, for defining a channel portion of said semiconductor region, and for controlling drain current flow between said source and said drain through said channel portion, said channel portion having a predetermined length along the direction of said drain current flow and a predetermined width along the direction transverse to said drain current flow, said drain and said gate means being adapted to be applied with a drain voltage and a gate bias voltage from external voltage sources, respectively, the improvement wherein:

said semiconductor region is formed of a semiconductor material having a low impurity concentration, and the product of the series resistance and the true transconductance of said field effect transistor is maintained less than one in at least a portion of the operative state of said transistor in which state there exists an unsaturated drain current versus drain voltage characteristic for any operative value of said gate bias voltage, said series resistance being the sum of the resistance in said source, the resistance from said source to said channel portion and the resistance of said channel portion, and said semiconductor region includes an intrinsic semiconductor region and n-type semiconductor layers provided on the ends of said intrinsic semiconductor region of which said source and said drain are provided, and in which said gate means comprises a mesh of p-type semiconductor material provided along a boundary region between the intrinsic semiconductor region and one of the n-type layers.

11. A field effect transistor comprising:

a semiconductor region comprising a low doped $n^-$ layer and a high doped $n^+$ layer of low resistance contiguous to said $n^-$ layer, a source provided at one end of said semiconductor region and having the same conductivity type as that of said $n^+$ layer, a drain provided at the other end opposed to the one end of said semiconductor region and having the same conductivity type as that of said $n^-$ layer, said drain being adapted to be applied with a drain voltage from an external voltage source to cause a drain current to flow between said drain and said source, a gate formed adjacent said semiconductor region to define a portion of said semiconductor region having predetermined dimensions, said gate being adapted to be applied with a gate voltage from an external voltage source, depletion layers extending from said gate, respectively, inwardly into said portion of said semiconductor region so as to face each other, to define at least one current channel in said portion of said semiconductor region, the degree of extension of said depletion layers into said portion of said semiconductor region being controlled by changes in said gate voltage, said channel having predetermined length and width in the absence of any applied voltage, said degree of extension of the depletion layers controlling said drain current, thereby defining a transconductance, said semiconductor region having a first series resistance between said source and said channel and having a second series resistance through said channel, wherein the length and width of said channel is selected so that the product of said transconductance and the sum of the resistance of said source, and said first series resistance and said second series resistance is maintained less than one in operative state of the transistor in which state a drain current is flowing.

12. A field effect transistor comprising:

a semiconductor region comprising an intrinsic semiconductor region, a highly doped $n^+$ layer of low resistance adjacent to one surface of said intrinsic semiconductor region and a low doped $n^-$ layer of high resistance coupled on the other surface of the intrinsic semiconductor region, a source provided on one end of said semiconductor region and having the same conductivity type as that of said $n^+$ layer, a drain provided at the other end opposed to said one end of said semiconductor region and having the same conductivity type as that of said $n^-$ layer, said drain being adapted to be applied with a drain voltage from an external voltage source to cause a drain current to flow between said drain and said source, gates formed adjacent to said semiconductor region to define a portion of said semiconductor region having predetermined dimensions, said gates being adapted to be applied with a gate voltage from an external voltage source, said gates being operative so that depletion layers extend from said gates, respectively, inwardly into said portion of said semiconductor region so as to face each other, to define at least one current channel in said portion of said semiconductor region, wherein the degree of extension of said depletion layers into said portion of said semiconductor region is controlled by changes in said gate voltage, said channel having predetermined length and width in the absence of any applied gate voltage, and wherein the degree of extension of the depletion layers controlling said drain current, thereby defining a transconductance, said semiconductor region having a first series resistance between said source and said channel and having a second series resistance through said channel, and the length and width of said channel being selected so that the product of said transconductance and the sum of the resistance of said source, said first series resistance and said second series resistance is maintained less than one in operative state of the transistor in which state a drain current is flowing.

13. A field effect transistor comprising:

a semiconductor region comprising an intrinsic semiconductor region and n-type layers coupled respectively one and the other of two opposed surfaces of the intrinsic semiconductor region, a source and a drain both having the same conductivity type as that of said n-type layer and provided at the opposite ends of said semiconductor region, said drain being adapted to be applied with a drain voltage from an external voltage source to cause a drain current to flow between said drain and said source, a gate comprising a mesh of p-type semiconductor material provided along a boundary region between the intrinsic region and one of the n-type layers, said gate being adapted to be applied with a gate voltage from an external voltage source, said gate being operative so that depletion layers extend from said gate, respectively, inwardly into said portion of said semiconductor region so as to face each other, thereby to define at least one current channel in said portion of said semiconductor region, wherein the degree of extension of said depletion layers into said portion of said semiconductor region is controlled by changes in said gate voltage, said channel having a predetermined length and width in the absence of any applied gate voltage, and wherein the degree of extension of the depletion layers controls said drain current, hereby defining a transconductance, said semiconductor region having a first series resistance between said source and said channel and having a second series resistance through said channel, and the length and width of said channel region is selected so that the product of said transconductance and the sum of the resistance of said source, said first series resistance and said second series resistance is maintained less than one in operative state of the transistor in which state a drain current is flowing.

14. A field effect transistor comprising:

a semiconductor comprising an intrinsic semiconductor region and n-type layers coupled respectively to one and the other of two opposed surfaces of the intrinsic semiconductor region, a source and a drain both having the same conductivity type as that of said n-type layer and provided at the opposite ends of said semiconductor region, said drain being adapted to be applied with a drain voltage from an external voltage source to cause a drain current to flow between said drain and said source, a gate comprising a mesh of p-type semiconductor material provided along a boundary region between the intrinsic semiconductor region and one of the n-type layers, said gate being adapted to be applied with a gate voltage from an external voltage source, said gate being operative so that depletion layers extend from said gate, respectively, inwardly into said portion of said semiconductor region so as to face each other, thereby to define at least one current channel in said portion of said semiconductor region, and wherein the degree of extension of said depletion layers into said portion of said semiconductor region is controlled by changes in said gate voltage, said channel having predetermined length and width in the absence of any applied gate voltage, and wherein the degree of extension of the depletion layers controls said drain current, thereby defining a transconductance, said semiconductor region having a first series resistance between said source and said channel and having a second series resistance through said channel, and wherein the length and width of said channel is selected so that the product of said transconductance and the sum of the resistance of said source, said first series resistance and said second series resistance is maintained less than one in operative state of the transistor in which state a drain current is flowing.

15. A field effect transistor comprising:

a semiconductor region having a conductivity type and having an impurity concentration:

source and drain semiconductor regions having the same conductivity type as that of said semiconductor region and provided at the opposite ends of said semiconductor region, said drain region being adapted to be applied with a drain voltage from an external voltage source to cause a drain current to flow between said drain region and said source region, at least a pair of gates provided at opposite sides of said semiconductor region and having projections which are inserted in said semiconductor region so as to oppose to each other, said gates being adapted to be applied with a gate voltage from an external voltage source, said gates being operative in that depletion layers extend from the junction into said semiconductor region, respectively, inwardly into said semiconductor region so as to face each other and have a formation like the shape of said projections, thereby to define at least one current channel in said portion of said semiconductor region, wherein the degree of extension of said depletion layers into said semiconductor region is controlled by changes in said gate voltage, said channel having predetermined channel dimensions in the absence of any applied gate voltage, said degree of extension of the depletion layers controlling said drain current through said channel, thereby defining a transconductance, said semiconductor region having a first series resistance between said source and said channel and having a second series resistance through said channel, said impurity concentration of said semiconductor region and said predetermined dimensions being selected so that the product of said transconductance and the sum of said first and second series resistances is maintained less than one in an operative state of the transistor in which state a drain current flows.

16. A field effect transistor according to claim 15, in which each of said projections is a rounded-off projection.

17. A field effect transistor according to claim 15, in which each of said projections is a wedge-shaped projection.

18. A field effect transistor according to claim 15, in which in that each of said projections is a hemispheric projection.

19. A field effect transistor according to claim 15, in which an impurity concentration of said channel is intrinsic.

20. A field effect transistor according to claim 15 in which an impurity concentration of the semiconductor material within said channel is lightly doped.

21. A field effect transistor comprising:
a first semiconductor layer having a first conductivity type,
a channel layer provided over said first semiconductor layer and having said first conductivity type,
a gate structure having a second conductivity type opposite to said first conductivity type, said gate structure being formed in said channel layer to define a plurality of channels,
a second semiconductor layer provided on said channel layer and having said first conductivity type,
a drain electrode provided on said first semiconductor layer,
a source electrode provided on said second semiconductor layer, and
a gate electrode attached to said gate structure, the improvement comprising:
the configuration of doping concentration of said first, second and channel layers are such that the product of the series resistance and the true transconductance of said field effect transistor is maintained less than one in the operative state of said transistor in which state a drain current is flowing to provide an unsaturated drain current versus drain voltage characteristic.

22. A field effect transistor according to claim 21, wherein said gate structure is a mesh-shaped structure.

23. A field effect transistor according to claim 21, wherein said gate structure is a stripe-shaped structure.

24. A field effect transistor according to claim 22, wherein said mesh-shaped structure is arranged such that a plurality of semiconductor regions are aligned in cross section.

25. A field effect transistor according to claim 23, wherein said stripe-shaped structure is arranged such that a plurality of semiconductor regions are aligned in cross section.

26. A field effect transistor according to claim 21, wherein said first and second semiconductor layers have a highly doped impurity concentration.

27. A field effect transistor according to claim 21, wherein said channel layer has a intrinsic impurity concentration.

28. A field effect transistor comprising:
a semiconductor region having a first conductivity type and having an impurity concentration:
source and drain semiconductor regions both having the same conductivity type as that of said semiconductor region and provided at the opposite ends of said semiconductor region, said drain region being adapted to be applied with a drain voltage from an external voltage source to cause a drain current to flow between said drain region and said source region,
a plurality of gates having a second conductivity type opposite to said first conductivity type and provided at opposite sides of said semiconductor region to define therein a portion of said semiconductor region wherein each gate comprises a ring having a thin thickness relative to the diameter thereof, said gates being adapted to be applied with a gate voltage from an external voltage source,
said gates being operative so that depletion layers extend from the junction of said gates and said semiconductor region, respectively, inwardly into said semiconductor region so as to face each other, to define at least one current channel in said portion of said semiconductor region,
and wherein the degree of extension of said depletion layers into said semiconductor region is controlled by the changes in said gate voltage, said channel has predetermined channel dimensions in the absence of any applied gate voltage, and said degree of extension of the depletion layers controls said drain current through said channel, thereby defining a transconductance,
said semiconductor region having a first series resistance between said source and said channel and having a second series resistance through said channel, and
said impurity concentration of said semiconductor region and said predetermined dimensions being selected so that the product of said transconductance and the sum of said first and second series resistances is maintained less than one in the operative state of the transistor in which state a drain current flows.

29. A field effect transistor comprising:
a semiconductor region having a first conductivity type and comprising a low doped n$^-$ layer and a highly doped n$^+$ layer of low resistance coupled on said n$^-$ layer,
a source provided at one end of said semiconductor region and having the same conductivity type as that of said semiconductor region,
a drain semiconductor region provided at the opposite end of said semiconductor region and having the same conductivity type as that of said semiconductor region, said drain region being adapted to be applied with a drain voltage from an external voltage source to cause a drain current to flow between said drain region and said source region, a plurality of gate elements having a second conductivity type opposite to said first conductivity type and formed adjacent to said semiconductor region to define therebetween a portion of said semiconductor region having predetermined dimensions, said gate elements being adapted to be applied with a gate voltage from an external voltage source, said gate elements being operative in that depletion layers extend from the junction of said gate elements and said semiconductor region, respectively, inwardly into said semiconductor region so as to face each other, to define at least one current channel in said portion of said semiconductor region, and wherein the degree of extension of said depletion layers into said semiconductor region is controlled by changes in said gate voltage, said channel has predetermined channel dimensions in the absence of any applied gate voltage, and said degree of extension of the depletion layers controls said drain current through said channel, thereby defining a transconductance, said semiconductor region having a first series resistance between said source and said channel and having a second series resistance through said channel, and said predetermined dimensions being selected so that the product of said transconductance and the sum of said first and second series resistances is maintained less than one in the operative state of the transistor in which state a drain current flows.

30. A field effect transistor comprising:

a semiconductor region having a first conductivity type and comprising an intrinsic semiconductor region, a highly doped $n^+$ layer of the low resistance coupled to one surface of the intrinsic semiconductor region and a low doped $n^-$ layer of high resistance coupled on the other surface of the intrinsic semiconductor region, a source semiconductor region provided on one end of said semiconductor region and having the same conductivity type as that of said semiconductor region, a drain semiconductor region provided at the opposite end of said semiconductor region and having the same conductivity type as that of said semiconductor region, said drain region being adapted to be applied with a drain voltage from an external voltage source to cause a drain current to flow between said drain region and said source region, a plurality of gate elements having a second conductivity type opposite to said first conductivity type and being formed adjacent to said semiconductor region to define therebetween a portion of said semiconductor region having predetermined dimensions, said gate elements being adapted to be applied with a gate voltage from an external voltage source, depletion layers extend from the junction of said gates and said semiconductor region, respectively, inwardly into said semiconductor region so as to face each other, to define at least one current channel in said portion of said semiconductor region, and wherein the degree of extension of said depletion layers into said semiconductor region is controlled by changes in said gate voltage, said channel has predetermined channel dimensions in the absence of any applied gate voltage, and wherein the degree of extension of the depletion layers controls said drain current through said channel, thereby defining a transconductance, said semiconductor region having a first series resistance between said source and said channel and having a second resistance through said channel, said predetermined dimensions being selected so that the product of said transconductance and the sum of said first and second series resistances is maintained less than one in the operative state of the transistor in which state a drain current flows.

31. A field effect transistor comprising:

a semiconductor region having a first conductivity type and having an impurity concentration and comprising an intrinsic semiconductor region and n-type layers coupled respectively one and the other of two opposed surfaces of the intrinsic semiconductor region, source and drain semiconductor regions having the same conductivity type as that of said semiconductor region and provided at the opposite ends of said semiconductor region, said drain region being adapted to be applied with a drain voltage from an external voltage source to cause a drain current to flow between said drain region and said source region, a plurality of gate elements comprising a mesh of p-type semiconductor provided along a boundary region between the intrinsic semiconductor region and one of the n-type layers, said gate elements being adapted to be applied with a gate voltage from an external voltage source, said gate elements being operative in that depletion layers extend from the junction of said gate elements and said semiconductor region, respectively, inwardly into said semiconductor region so as to face each other, to define at least one current channel in said portion of said semiconductor region, and wherein the degree of extension of said depletion layers into said semiconductor region is controlled by changes in said gate voltage, said channel has predetermined channel dimensions in the absence of any applied gate voltage, and said degree of extension of the depletion layers controls said drain current through said channel, thereby defining a transconductance, said semiconductor region having a first series resistance between said source and said channel and having a second series resistance through said channel, and said impurity concentration of said semiconductor region and said predetermined dimensions being selected so that the product of said transconductance and the sum of said first and second series resistances is maintained less than one in the operative state of the transistor in which state a drain current flows.

32. A field effect transistor comprising:

a semiconductor region having a first conductivity type and having an impurity concentration and comprising an intrinsic semiconductor region and n-type layers coupled respectively one and the other of two opposed surfaces of the intrinsic semiconductor region, source and drain semiconductor regions having the same conductivity type as that of said semiconductor region and provided at opposite ends of said semiconductor region, said drain region being adapted to be applied with a drain voltage from an external voltage source to cause a drain current to flow between said drain region and said source region, a plurality of gate elements comprising a mesh of p-type semiconductor provided along a boundary region between the intrinsic semiconductor region and one of the n-type layers, said gate elements being adapted to be applied with a gate voltage from an external voltage source, said gate elements being operative in that depletion layers extend from the junction of said gate elements and said semiconductor region, respectively, inwardly into said semiconductor region so as to face each other, to define at least one current channel in said portion of said semiconductor region, and wherein the degree of extension of said depletion layers into said semiconductor region is controlled by changes in said gate voltage, said channel has predetermined channel dimensions in the absence of any applied gate voltage, and said degree of extension of the depletion layers controls said drain current through said channel, thereby defining a transconductance, said semiconductor region having a first series resistance between said source and said channel and having a second series resistance through said channel, and said impurity concentration of said semiconductor region and said predetermined dimensions being selected so that the product of said transconductance and the sum of said first and second series resistances is maintained less than one in the operative state of the transistor in which state a drain current flows.

33. A field effect transistor, comprising a semiconductor crystal, a source and a drain respectively provided at both ends of the semiconductor crystal, and a gate provided at sides of the semiconductor crystal, the improvement characterized in that a product of a series resistance and a transconductance in the field effect transistor is less than one, so that the field effect transistor is operable in the state of no punch through effect, the depletion region therein being always less than the entire length of the channel thereof.

34. A field effect transistor according to claim 33, in which the channel has a length to width ratio of about one or two tenth without depletion layer.

35. A field effect transistor according to claim 33, in which said gate comprises at least a pair of gates provided at opposite sides of the semiconductor crystal and having projections which are inserted in the semiconductor crystal so as to oppose to each other, wherein shapes of depletion layers having a formation like to the shape of the projections.

36. A field effect transistor according to claim 35, in which each of said projections is a rounded-off projection.

37. A field effect transistor according to claim 35, in which each of said projections is a wedge-shaped projection.

38. A field effect transistor according to claim 35 in which in that each of said projections is a hemispheric projection.

39. A field effect transistor according to claim 33, in which said gate comprises a ring having a thin thickness in comparison with the diameter thereof.

40. A field effect transistor according to claim 33, in which the semiconductor crystal comprises a highly doped $n^+$ layer of low resistance and a low doped $n^-$ layer coupled on the layer, said gate being provided along a boundary region between the doped layers.

41. A field effect transistor according to claim 33, in which the semiconductor crystal comprises an intrinsic semiconductor crystal, a highly doped $n^+$ layer of low resistance coupled on one surface of the intrinsic semiconductor crystal, and a low doped $n^-$ layer of high resistance coupled on the other surface of the intrinsic semiconductor crystal, said gate being provided along a boundary region between the highly doped $n^+$ layer and the intrinsic semiconductor crystal.

42. A field effect transistor according to claim 33, in which the semiconductor crystal comprises an intrinsic semiconductor crystal, and n-type layers coupled respectively one and the other of two opposed surfaces of the intrinsic semiconductor crystal, said gate comprising a mesh of p-type semiconductor provided along a boundary region between the intrinsic semiconductor crystal and one of the n-type layers.

43. A field effect transistor according to claim 33 characterized in that the semiconductor crystal comprises an intrinsic semiconductor crystal, and n-type layers coupled respectively one and the other of two opposed surfaces of the intrinsic semiconductor crystal, said gate comprise a mesh of p-type semiconductor provided along a boundary region between the intrinsic semiconductor crystal and one of the n-type layers.

44. In a field effect transistor having a body of n-type semiconductor material which includes a source at one end and a drain at an opposite end thereof for conducting current through a channel between said source and drain in response to a voltage potential applied therebetween, and at least one p-type gate region located laterally of said channel and defining the lateral dimensions thereof, the improvement comprising:

said gate region having a gate length L to define a short channel in the direction of current flow between the source and drain and a lateral gate spacing "2a" that is large relative to said length L thereby to define a short channel having a large area that is substantially normal to the direction of current flow between the source and drain, and said doping concentration N, gate length L, gate spacing "2a" and source-to-gate spacing being arranged so that the product of $R_S \times G_m < 1.0$ is satisfied where $R_S$ is the series resistance, to provide an unsaturated drain current versus drain voltage characteristic.

45. A field effect transistor according to claim 44 wherein the ratio L/a is between 0.1 and 02.

46. A field effect transistor according to claim 44, wherein $R_S$ is the sum of the resistance of the source, the resistance from the source to the channel, and the resistance of the channel.

47. A field effect transistor according to claim 44, wherein the doping concentration N of said channel is intrinsic.

48. A field effect transistor according to claim 44 wherein the doping concentration N of said channel is lightly doped.

49. In a field effect transistor having a body of semiconductor material of a first conductivity type which includes a source at one end and a drain at an opposite end thereof for conducting current through a channel between said source and drain in response to a voltage potential applied therebetween, and at least one gate region of a second conductivity type region located laterally of said channel and defining the lateral dimensions thereof, the improvement comprising:

said gate region having a gate length L in the direction of current flow to define a short channel between the source and drain and a lateral gate spacing "2a" that is large relative to said length L thereby to define a short channel having a large area that is substantially normal to the direction of said current flow between the source and drain, said gate region being closely spaced to said source region, said semiconductor material having such a doping concentration N so as to enable operation of the transistor under applied drain and gate potentials in which a substantially depleted region is generated between said channel and drain, and said doping concentration N, gate length L, gate spacing "2a" and source-to-gate spacing being arranged so that the product $R_S \times G_m < 1.0$ where $R_S$ is the series resistance, to provide triode-like characteristics.

50. A field effect transistor according to claim 49 wherein the ration L/a is between 0.1 and 0.2.

51. A field effect transistor according to claim 49, wherein $R_S$ is the sum of the resistance of the source, the resistance from the source to the channel, and the resistance of the channel.

52. A field effect transistor according to claim 49, wherein the doping concentration N of said channel is intrinsic.

53. A field effect transistor according to claim 49, wherein the doping concentration N of said channel is lightly doped.

54. In a field effect transistor comprising:

a semiconductor region of a first conductivity type, a source and a drain provided at opposite ends of said semiconductor region, and gate means of p-type semiconductor material, provided adjacent to said semiconductor region, for defining a channel portion of said semiconductor region and for controlling the flow of drain current between said source and said drain through said channel portion, said channel portion having a predetermined length along the direction of said drain current and a predetermined width along the direction transverse to the flow of said drain current, said drain and said gate means being adapted to be applied with a drain voltage and a gate bias voltage from external voltage sources, respectively, the improvement wherein:

said semiconductor region is formed of a semiconductor material having a low impurity concentration;

the product of the series resistance and the true transconductance of said field effect transistor is maintained less than one in at least a portion of the operative state of said transistor in which state there exists an unsaturated drain current versus drain voltage characteristic for any operative value of said gate bias voltage; and said series resistance being the sum of the resistance in said source, the resistance from said source to said channel portion and the resistance of said channel portion.

55. A field effect transistor comprising:

a semiconductor region having one conductivity type and having an impurity concentration, a source and a drain both having the same conductivity type as that of said semiconductor region and provided at the opposite ends of said semiconductor region, said drain being adapted to be applied with a drain voltage from an external voltage source to cause a drain current to flow between said drain and said source, at least a pair of gates provided at opposite sides of said semiconductor region and having projections which are inserted in said semiconductor region so as to oppose to each other, said gates being adapted to be applied with a gate voltage from an external voltage source, depletion layers extending from said gates, respectively, inwardly into a portion of said semiconductor region so as to face each other and being formed according to the shape of said projections, thereby to define at least one current channel in said portion of said semiconductor region, the degree of extension of said depletion layers into said portion of said semiconductor region being controlled by changes in said gate voltage, said channel having a predetermined length and width in the absence of any applied gate voltage, said degree of extension of the depletion layers controlling said drain current, thereby defining a transconductance, said semiconductor region having a first series resistance between said source and said channel and having a second series resistance through said channel, and said impurity concentration of said semiconductor region and the length and width of said channel being selected so that the product of said transconductance and the sum of the resistance of said source, said first series resistance and said second series resistance is maintained less than one in the operative state of the transistor in which state a drain current is flowing.

56. A field effect transistor comprising:

a semiconductor region having one conductivity type and having an impurity concentration, a source and a drain both having the same conductivity type as that of said semiconductor region and provided at the opposite ends of said semiconductor region, said drain being adapted to be applied with a drain voltage from an external voltage source to cause a drain current to flow between said drain and said source, gates provided at opposite sides of said semiconductor region to define a portion of said semiconductor region and each comprising a ring having a thin thickness in comparison with the diameter thereof, said gates being adapted to be applied with a gate voltage from an external voltage source, depletion layers extending from said gates, respectively, inwardly into said portion of said semiconductor region so as to face each other, to define at least one current channel in said portion of said semiconductor region, the degree of extension of said depletion layers into said portion of said semiconductor region being controlled by changes in said gate voltage, said channel having predetermined length and width in the absence of any applied gate voltage, said degree of extension of the depletion layers controlling said drain current, thereby defining a transconductance, said semiconductor region having a first series resistance between said source and said channel and having a second series resistance through said channel, said impurity concentration of said semiconductor region and the length and width of said channel being selected so that the product of said transconductance and the sum of the resistance of said source, said first series resistance and said second series resistance is maintained less that one in the operative state of the transistor in which state a drain current is flowing.

57. In a junction field effect transistor having a body of n-type semiconductor material which includes a source region at one end and a drain region at an opposite end thereof for conducting current through a channel region which lies along a source-to-drain spacing between said source and drain regions in response to a voltage potential applied between said source and drain regions, and at least one pair of p-type gate regions that are spaced laterally of said channel region and wherein the spacing between each of said gate regions defines lateral dimensions of said channel region, the improvement comprising:

said gate regions having a gate length L in the direction of said source to drain current flow between the source and drain regions which defines a short channel in said channel region and said gate regions being separated by a lateral spacing "2a" across said channel region wherein said spacing is large relative to said gate length L thereby to further define said short channel in a manner to have a large area that is substantially normal to the direction of current flow between the source and drain regions, and said gate length L, gate spacing "2a" and source-to-gate spacing being arranged so that the product $R_S \times G_m < 1.0$ where $R_S$ is the sum of the resistances from the source to the channel and the resistance of the channel so as to provide triode-like operating characteristics of said junction field effect transistor.

58. The invention as recited in claim 57 wherein the ratio L/a is between 0.1 and 0.2.

59. The invention as recited in claim 57 wherein $R_S$ is the sum of the resistances of the source region, the resistance from the source region to the channel, and the resistance of the channel region.

60. In a junction field effect transistor having a body of semiconductor material of a first conductivity type which includes a source region at one end and a drain region at an opposite end thereof for conducting current along a source-to-drain spacing through a channel between said source and drain regions in response to a voltage potential applied therebetween, and at least one gate region of a second conductivity type located laterally of said channel and defining the lateral dimensions of said channel, the improvement comprising:

said at least one gate region having a gate length L in the direction of current flow to define a short channel between the source and drain regions and a lateral spacing "2a" that is large relative to said length L thereby to define a short channel having a large area that is substantially normal to the direction of current flow between the source to drain regions, said gate region being closely spaced to said source region, and said gate length L, gate spacing "2a" and source-to-gate spacing being arranged so that the product $R_S \times G_m < 1.0$ where $R_S$ is the sum of the resistances from the source to a channel and the resistance of the channel so as to provide triode-like operating characteristics of said junction field effect transistor.

61. The invention as recited in claim 60 wherein the ratio L/a is between 0.1 and 0.2.

62. The invention as recited in claim 60 wherein $R_S$ is the sum of the resistances of the source region, the resistance from the source region to the channel, and the resistance of the channel region.

* * * * *